United States Patent [19]

Tominaga

[11] 4,263,614
[45] Apr. 21, 1981

[54] PHASE TRACKING LOOP CIRCUIT

[75] Inventor: Kiyonori Tominaga, Tokyo, Japan

[73] Assignee: Sony Corporation, Tokyo, Japan

[21] Appl. No.: 102,973

[22] Filed: Dec. 14, 1979

[30] Foreign Application Priority Data

Dec. 22, 1978 [JP] Japan .................. 53-163811

[51] Int. Cl.$^3$ .................. H04N 9/24; H03D 3/22
[52] U.S. Cl. .................. 358/69; 329/134; 329/136; 329/137
[58] Field of Search .................. 358/67–70; 329/103, 120, 134, 136, 137, 145; 455/214; 375/80, 81

[56] References Cited

U.S. PATENT DOCUMENTS

| | | | |
|---|---|---|---|
| 4,066,972 | 1/1978 | Ishigaki et al. | 329/137 |
| 4,079,330 | 3/1978 | Ishigaki et al. | 329/137 |

*Primary Examiner*—John C. Martin
*Attorney, Agent, or Firm*—Lewis H. Eslinger; Alvin Sinderbrand

[57] ABSTRACT

A phase-tracking loop circuit which can be used, for example, as an FM detector or as a frequency-tracking control circuit to control the index signal of a beam-index cathode ray tube (CRT), includes an adder receiving an input signal of fluctuating frequency, a tracking filter coupled to the output of the adder and whose passband center frequency is shiftable, in response to a control voltage, to follow changes in the frequency of the input signal, an attenuator feeding an attenuated version of the output from the tracking filter back to the adder for combining in the latter with the input, and a phase comparator comparing the phase of the output of the adder with the output of the tracking filter to provide a corresponding control voltage to the tracking filter. If used as an FM detector, the control voltage can also constitute a demodulated signal. If used to control color switching in a beam index CRT, a controlled signal tracking the phase of the index signal can be derived from a phase-locked loop circuit which provides one of the inputs to the phase comparator in response to the output of the tracking filter.

14 Claims, 10 Drawing Figures

PHASE TRACKING LOOP CIRCUIT

BACKGROUND OF THE INVENTION

1. Field of the Invention

The present invention relates generally to a phase-tracking loop circuit for processing signals whose frequency fluctuates, such as FM signals, PM signals, or AM signals whose carrier frequency is unstable.

2. Description of the Prior Art

Phase-tracking loop (PTL) circuits have been proposed, particularly for use as detectors for FM signals. One such proposal is discussed in Ishigaki et al., Phase-Tracking Loop (PTL) Detector for FM Signals and its Application to an FM Receiver, IEEE Transactions on Consumer Electronics, Vol. CE-24, No. 3, August, 1978, pages 215-225. Such a PTL circuit utilizes a tracking filter, which is a narrow band variable tuning filter, a phase shifting, or Hilbert filter, a phase comparator, a loop filter and a loop amplifier. The phase comparator provides a feedback signal to tune the tracking filter to track the instantaneous phase variation of the incoming FM signal. The phase shifting Hilbert filter associated with the PTL circuit is designed to exhibit a flat amplitude characteristic and to provide a uniform 90° phase shift. To provide such a characteristic, the Hilbert filter normally consists of a differentiator followed by a limiter, although it could also be formed of an integrator followed by a limiter. In either case a flat output is provided, and the phase of the output signal of the Hilbert filter is shifted +90° or −90°, respectively, so that a 90° phase-shifted signal can be applied to the phase comparator for comparison with the signal passed by the tracking filter.

Unfortunately, such PTL circuits have been quite susceptible to misoperation caused by interference, noise, or other stray signals above or below the bandwidth of the tracking filter. If a differentiator circuit is used as a phase shifter, any interfering signal having a frequency higher than the signal being processed will be emphasized in the differentiator circuit and fed to the phase comparator. It is apparent that such high frequency interference or noise will be compared with the output of the tracking filter, and will thus prevent accurate phase tracking of the input signal.

Alternatively, if an integrator circuit is used as the phase shifter, any interference or noise signals having a frequency lower than the input signal will be emphasized, and will also prevent accurate phase-tracking of the input signal.

One possible use of the phase-tracking loop circuit, to wit, in providing the index signal for a beam-index color cathode ray tube in a video receiver, is made more difficult because of the above-mentioned susceptibility of the PTL circuit to interference or noise. Several sources of such interference and noise are inherent in a beam index color television receiver, such as variations in the beam scanning velocity, variations in cathode ray or electron beam current, and inherent noise in the photodetector used to provide the index signal. These examples of interference and noise are quite difficult to avoid by design of the television receiver itself, and thus require an improvement in the PTL circuit, such as that offered according to the present invention.

OBJECTS AND SUMMARY OF THE INVENTION

It is an object of the present invention to provide an improved phase-tracking loop circuit which avoids the above problems of the prior art.

It is another object of the present invention to provide a phase-tracking loop circuit in which the possibility of misoperation due to interference or noise signals, whether of high or of low frequency, is minimized.

It is a further object of the present invention to provide a phase-tracking loop circuit suitable for use with a beam index color television receiver.

It is a still further object of the present invention to provide a phase-tracking loop circuit, suitable for use with a beam index color television receiver, and which will provide a controlled signal for effecting color switching of such receiver, with the controlled signal closely following fluctuations in the index signal provided by the cathode ray tube of the receiver, but being substantially insensitive to noise and interference inherent in the index signal.

According to an aspect of the invention, a phase-tracking loop circuit comprises an adder circuit for combining an input signal of varying frequency with another signal and providing a combined signal therefrom; a tracking filter coupled to receive the combined signal and to pass a band of frequencies having a center frequency which is shiftable in response to a control signal applied thereto so that the passband center frequency is made to follow changes in the frequency of the input signal; an attenuator connected to the output of the tracking filter for feeding an attenuated version of such output of the tracking filter back to the adder circuit as the other signal applied to the latter; and a phase comparator for comparing the phase of the combined signal from the adder circuit with the phase of the output from the tracking filter and providing a corresponding control signal to the tracking filter for determining said center frequency.

When used in conjunction with a beam-index color television receiver, the phase-tracking loop circuit according to this invention may have a phase-locked loop circuit (PLL) providing first and second output signals in response to the output of the tracking filter. The first output signal from the PLL is provided as the output signal of the PTL circuit, for example, to control gating or color switching of the cathode beam of the beam-index color television receiver. The second signal from the PLL is provided as a 90° phase-shifted signal to the phase comparator of the PTL circuit.

The above, and other objects, features and advantages of the present invention, will be apparent from the following detailed description of illustrative embodiments to be read in conjunction with the accompanying drawings.

DESCRIPTION OF THE PREFERRED EMBODIMENTS

Figure 1:
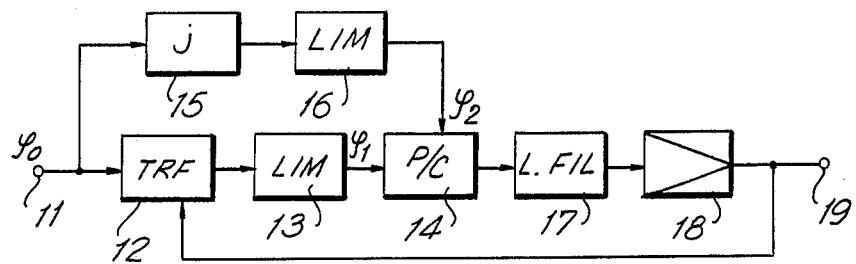
FIG. 1 is a schematic block diagram of a conventional phase-tracking loop (PTL) circuit.

Referring in detail to the drawings, and initially to FIG. 1 thereof, it will be seen that a previously-proposed phase-tracking loop (PTL) circuit, intended for use as a detector circuit in an FM receiver, employs a tracking filter and a feedback circuit arranged so as to be sensitive to instantaneous changes in the phase of an input signal. In such a PTL circuit, an input signal, such as a received FM signal, is applied to an input terminal 11 and is then fed through a tracking filter 12 and a limiter 13 to one input of a phase comparator 14. The input signal is also applied to a phase shifter 15 and thence through a limiter 16 to another input of the phase comparator 14. The phase comparator 14 provides an output signal in response to the relative phases of the signals applied to the two terminals thereof, and such output signal is supplied through a loop filter 17, which can be an integrator, to a loop amplifier 18. The output of the loop amplifier 18 is fed back to a control terminal of the tracking filter 12 as a control signal therefor, and is also applied to an output terminal 19 as a demodulated FM information signal.

Figure 2:
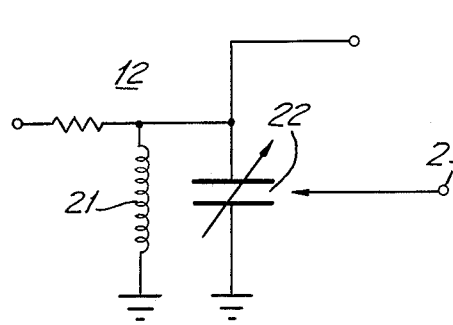
FIG. 2 is a schematic diagram of a tracking filter that may be used in the PTL circuit of FIG. 1.

A circuit suitable for the tracking filter 12 is shown schematically in FIG. 2 and is generally designed to pass a band of frequencies centered about the frequency of the input signal. Such tracking filter circuit is shown to include a tank circuit formed of a coil 21 and an electrically variable capacitance 22 adjustable by means of a control signal applied to a terminal 23 thereof. The tracking filter functions so that the band of frequencies passed by the tracking filter 12 is shifted in response to changes in the control signal applied thereto, for example, from loop amplifier 18, with the result that the passband center frequency of the tracking filter 12 changes to follow changes in the frequency of the input signal applied to terminal 11.

The phase shifter 15 and limiter 16 are designed to function as a 90° Hilbert filter so that signal passing therethrough has a 90° phase shift imparted thereto before being applied to the phase comparator 14. The phase shifter 15 may be a differentiator providing a phase shift of +90°, or +j, although an integrator circuit could be used instead.

Figure 3:
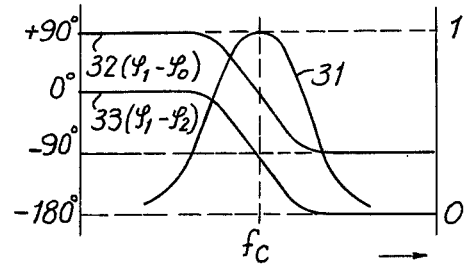
FIGS. 3 and 4 are graphs used for explaining the operation of the circuit shown in FIG. 1.

Referring now to FIG. 3, it will be seen that the amplitude characteristic of tracking filter 12 is represented by curve 31, while the phase characteristic thereof (assuming the center frequency $f_c$ is held constant) is represented by curve 32. It is apparent from curve 32 that as the frequency of the input signal is raised from below $f_c$ to above $f_c$, the phase of the signal passed by tracking filter shifts gradually from 90° in advance of the input signal to 90° behind the phase of the input signal.

If it is assumed that the phase of the input signal is $\phi_0$, the phase of the signal passed by the tracking filter 12 is $\phi_1$, and the phase of the signal passed by the phase shifter 15 and limiter 16 to the phase comparator 14 is $\phi_2$, then the phase difference of the two signals applied to the phase comparator 14 is represented by the expression $(\phi_1 - \phi_2)$. Since the phase shifter 15 imparts a +90° phase shift, $\phi_1 - \phi_2 = (\phi_1 - \phi_0) - (\phi_2 - \phi_0) = (\phi_1 - \phi_0) - 90°$, and the characteristic of the phase difference $(\phi_1 - \phi_2)$ is shown by curve 33 on FIG. 3.

Figure 4:
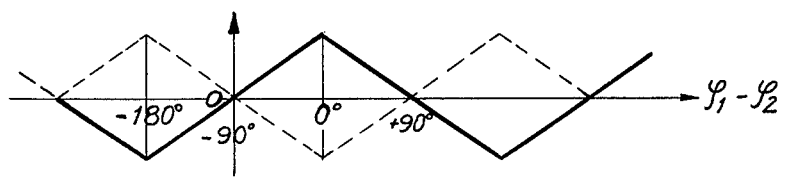

The relation of the output voltage of phase comparator 14 in respect to the phase difference $(\phi_1 - \phi_2)$ is shown by the solid line in FIG. 4, while the output of the loop amplifier 18, which is here an inverting amplifier, is represented by the dotted line in FIG. 4.

The biasing voltage of tracking filter 12 and the quiescent output voltage of amplifier 18 are selected so that whenever an unmodulated carrier-wave signal is applied to input terminal 11, the tracking filter 12 is biased so that its center frequency $f_c$ coincides with the carrier frequency. When the input signal is such an unmodulated carrier wave, the phase difference $(\phi_1 - \phi_0)$ is 0°, and the phase difference $(\phi_2 - \phi_0)$ is +90. In such a case, the phase difference $(\phi_1 - \phi_2)$ is −90° and, as a result, the phase comparator 14 provides a neutral output, so that the output voltage from the loop amplifier 18, that is, the control voltage supplied to tracking filter 12, will not shift the frequency of the tracking filter 12. However, if an angularly-modulated signal, such as an FM signal, is applied at the input terminal 11, as the frequency of the input signal increases, the phase difference $(\phi_1 - \phi_0)$ becomes negative while the phase difference $(\phi_2 - \phi_0)$ remains +90°. Therefore, as shown in curve 33, the phase difference $(\phi_1 - \phi_2)$ decreases beyond −90° and approaches −180°. Because the phase difference between the signals applied to phase comparator 14 decreases beyond −90°, the output signal from phase comparator 14 becomes negative, and the output, or control voltage from loop amplifier 18 will increase, thereby causing the passband center frequency of tracking filter 12 to increase so as to follow the changes in the instant frequency of the input signal.

When the angularly-modulated input signal shifts to a frequency lower than that of the center frequency $f_c$ of tracking filter 12, the phase difference $(\phi_1 - \phi_0)$ will increase towards +90°. Since the phase difference $(\phi_2 - \phi_0)$ is +90°, The phase difference $(\phi_1 - \phi_2)$ between the signals applied to the phase comparator 14 increases from −90° towards 0°. As a result, the output signal from phase comparator 14 becomes more positive, and the output voltage from the loop amplifier becomes more negative, so that the control voltage applied to tracking filter 12 causes the passband center frequency $f_c$ to shift downwardly to follow the downward shift in the instant frequency of the input signal.

Clearly, whenever the passband center frequency $f_c$ of the tracking filter 12 is shifted beyond the instantaneous frequency of the input signal, that is, above it or below it, the phase difference $(\phi_1 - \phi_0)$ will become more positive or more negative, respectively, so that the passband center frequency $f_c$ of tracking filter 12 is urged back towards the instantaneous frequency of the input signal.

As described above in connection with the previously-proposed PTL circuit of FIG. 1, the passband center frequency $f_c$ of tracking filter 12 tracks the frequency of the input signal. Because the control voltage provided at the output of loop amplifier 18 is proportional to the center frequency $f_c$ of tracking filter 12, that control voltge can also be provided at output terminal 19 as a frequency-demodulated information signal.

Although the PTL circuit of FIG. 1 does provide satisfactory operation when used as a frequency demodulator, it is too sensitive to noise to provide satisfactory service in many other applications, such as, in a circuit to provide the index signal in a beam-index color television receiver. Because a differentiator circuit is used as the phase shifter 15, any interference or noise having a frequency above the passband center frequency $f_c$, even though filtered out by tracking filter 12, will tend to be emphasized in phase shifter 15, and will be applied to the phase comparator 14. It is clear that if such high-frequency noise exists, phase comparator 14 will erroneously cause the tracking filter 12 to follow phase and frequency differences between the input signal and the noise. The presence of such noise prevents accurate tracking of the index signal by tracking filter 12.

Similarly, if an integrator is used as the phase shifter 15, low frequency interference and noise, that is, interference and noise whose frequency is below the passband center frequency $f_c$, will be emphasized, and will similarly adversely affect the operation of the phase comparator 14.

An embodiment of a phase-tracking loop circuit according to the present invention will now be described with reference to FIG. 5 in which an input signal received at an input terminal 41 is applied to one input of an adder 42 which has its output connected to a tracking filter 43. The signal passed by the tracking filter 43 is applied, after being attenuated in an attenuator 44, to another input of adder 42 so that the signal applied to the tracking filter is a combined signal formed by adding the attenuator signal to the input signal. In other words, attenuator 44 forms a positive feedback path for feeding the output from the tracking filter 43 back to the input thereof. The output signal from tracking filter 43 is also applied through a 90° phase shifter 45 and a limiter 46 to one input of a phase comparator 47. The combined signal from adder 42 is also applied through a limiter 48 to another input terminal of phase comparator 47. Phase comparator 47, on the basis of its comparison of the signals applied thereto through limiters 46 and 48, provides an output signal which is filtered in a loop filter 49 and amplified in a loop amplifier 50. The output of amplifier 50 is fed back to the tracking filter 43 as a control voltage for controlling its passband center frequency $f_c$. If the embodiment shown in FIG. 5 is used as an FM demodulator, a demodulated output can also be derived at an output terminal 51 connected to the output of loop amplifier 50.

Figure 6:
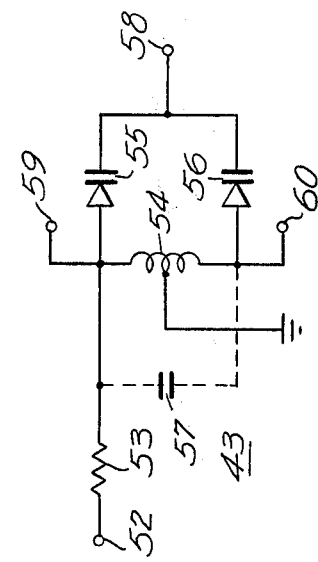
FIG. 6 is a diagram of a tracking filter which is desirably used in the PTL circuit of FIG. 5.

A desirable construction of tracking filter 43 is shown in greater detail in FIG. 6. In such tracking filter 43, an input terminal 52 receives the input signal which is passed across an input resistor 53 to one end of a center-tapped coil 54. A pair of series-connected voltage-controlled capacitors 55,56 are arranged with their anodes connected to respective ends of the coil 54 and with their cathodes connected to each other. If desired, a capacitor 57 can also be connected across the coil 54, as indicated in broken lines, to adjust the center passband frequency of the tracking filter 43. The center terminal of coil 54 is connected to ground, and the junction formed by the cathodes of the voltage-controlled capacitors 55,56 is connected to a control voltage input terminal 58 to receive the control voltage supplied from loop amplifier 50. The filtered output of tracking filter 43 is obtained across a pair output terminals 59,60, each connected to a respective end of coil 54.

Figure 5:
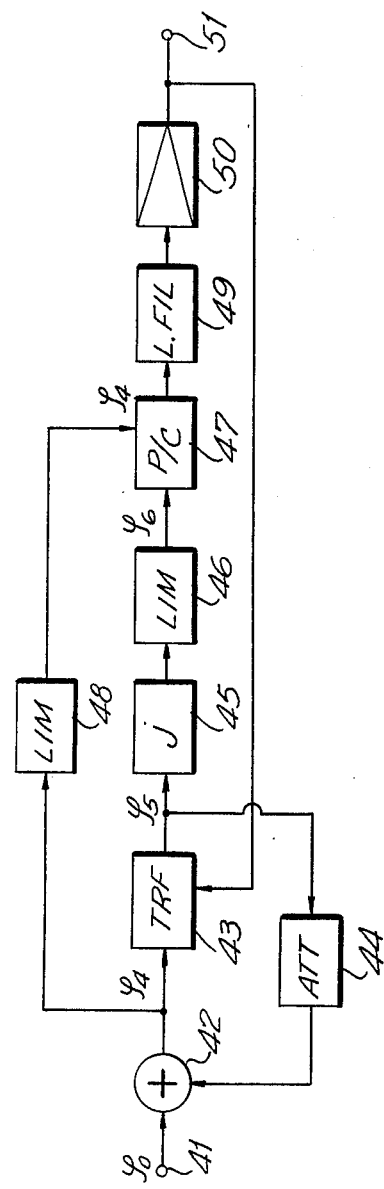
FIG. 5 is a schematic block diagram showing a PTL circuit according to an embodiment of the present invention.

In the embodiment shown in FIG. 5, the tracking filter 43 will have an amplitude characteristic and a phase characteristic similar to those represented by curves 31 and 32, respectively, in FIG. 3. Accordingly, if the attenuation factor (sometimes called the attenuation gain) of attenuator 44 is taken to be A, where $0 < A < 1$ if the input is assumed to have the value of 1, the amplitude and phase characteristics of the combined signal from adder 42, which is the input signal fed to tracking filter 43, will be represented by the curves 34 and 35, respectively, shown in FIG. 7, and the amplitude and phase characteristics of the output of tracking filter 43 will follow the curves 36 and 37, respectively, of FIG. 8. If it is assumed that the phase of the input signal applied to input terminal 41 is $\phi_0$, the phase of the combined signal provided from adder 42 to one input terminal of phase comparator 47 is $\phi_4$, the phase of the signal passed by tracking filter 43 is $\phi_5$, and the phase of the phase-shifted signal provided from phase shifter 45 and limiter 46 to another input of phase comparator 47 is $\phi_6$, then the phase shift provided between input terminal 41 and limiter 46 can be expressed as:

$$\phi_6 - \phi_0 = (\phi_5 - \phi_0) + (\phi_6 - \phi_5) = (\phi_5 - \phi_0) + 90°.$$

Figure 8:
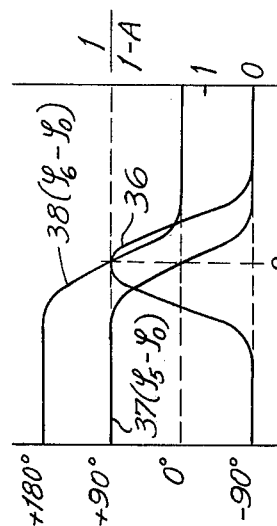
Figure 9:
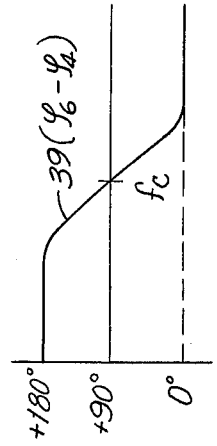

Thus, the phase characteristic of limiter 46, that is, the phase difference $\phi_6 - \phi_0$, will follow the curve 38 of FIG. 8. Furthermore, since $(\phi_6 - \phi_4) = (\phi_6 - \phi_0) - (\phi_4 - \phi_0)$, the characteristic of the phase difference $(\phi_6 - \phi_4)$, that is, the phase difference of the signals applied to phase comparator 47, changes with respect to the frequency of the input signal as shown by the curve 39 of FIG. 9. Such phase difference varies from $+180°$ for frequencies below the bandpass center frequency $f_c$, to $0°$ for frequencies above the bandpass center frequency $f_c$.

In the embodiment of FIG. 5, the output characteristic of phase comparator 47, which represents the relationship of the output signal thereof to the phase difference $(\phi_6 - \phi_4)$, is similar to that shown by the solid line in FIG. 4. Furthermore, because of the position of phase shifter 45 in the embodiment of FIG. 5, loop amplifier 50 is a non-inverting amplifier, and the characteristic of the output voltage of loop amplifier 50 in respect to the phase difference $(\phi_6 - \phi_4)$ is also proportioned to that indicated by the solid line in FIG. 4.

In the embodiment of the PTL circuit shown in FIG. 5, the center frequency $f_c$ of tracking filter 43 is made to follow any changes in the instantaneous frequency of the input signal in a manner similar to that previously described with reference to the circuit shown in FIG. 1, and a frequency demodulated information signal can be derived from output terminal 51.

Figure 7:
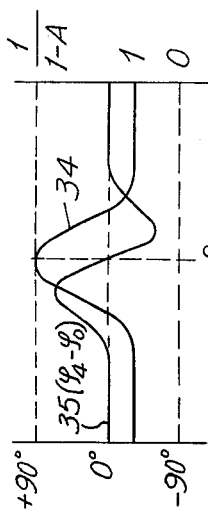
FIGS. 7, 8 and 9 are graphs used for explaining the operation of the PTL circuit shown in FIG. 5.

However, unlike such previously-proposed PTL circuit, the PTL circuit according to the present invention prevents undesired noise from affecting either input of the phase comparator 47 and thus provides accurate tracking of the PTL circuit despite the occurence of noise, whether above or below the passband center frequency $f_c$. Such interference or noise is filtered out as follows:

In a first signal path to one input of phase comparator 48, which first path is formed by adder 42, tracking filter 43, phase shifter 45 and limiter 46, the tracking filter 43 will filter out signals which are not near the passband center frequency $f_c$. This operation is similar to that of the corresponding portions of the previously-proposed PTL circuit shown in FIG. 1. However, in the PTL circuit according to this invention, a second signal path to the other input of phase comparator 47 also includes tracking filter 43. Such second path, which includes adder 42 and limiter 48, provides to phase comparator 47 a combined signal in which an attenuated version of the output of the tracking filter 43 is added to the input signal. If the phase $\phi_0$ of the input signal shifts due to interference or noise, the attenuated version of the output of tracking filter 43 provided from attenuator 44 will be out of phase with the input signal, so that the phase characteristic $(\phi_4 - \phi_0)$ of adder 42 will follow the curve 35 of FIG. 7. Furthermore, because the attenuated signal and the noise in the input signal are out of phase with one another, the amplitude characteristic of the combined signal from the adder 42 will follow the curve 34 of FIG. 7, and, because of the phase difference of such noise and interference in respect to the attenuated signal, such noise and interference will be filtered out. The sharpness or quality of the characteristic 34 of the adder 42 depends on the attenuation factor A. The ratio of the amplitude of signals in the output of adder 42 near the passband center frequency $f_c$, relative to the amplitude of signals far from the center frequency $f_c$, is given by the expression $1/(1-A)$, as shown in FIG. 7. A typical value for attenuation factor A is 0.5.

Because the signal fed from limiter 46 to one input of phase comparator 47 and the signal fed from limiter 48 to the other input of phase comparator 47 are both filtered as described above, noise and interference are prevented from reaching either input of the phase comparator 47, and misoperation is prevented. Nevertheless, the tracking filter 43 is still able to follow fluctuations in the phase and frequency of the input signal.

It is apparent that many variations of the arrangement shown in FIG. 5 are possible. For instance, the phase filter 45 could be placed following the limiter 46. Furthermore, the differentiator phase shifter 45 could be replaced by an integrator phase shifter located between adder 42 and limiter 48. Moreover, the inclusion of phase shifters in the PTL circuit is not essential. It is convenient to construct a phase comparator in which a neutral output is provided when the input signals thereto are separated in phase by 90°, and, therefore, phase comparator 47 is assumed to be of that type and is provided with the associated phase shifter 45 to achieve the 90° normal phase separation. However, if a phase comparator of a different design is employed, it would be apparent to suitably modify or eliminate the phase shifter.

Furthermore, in the above-described embodiment, an output can be derived from the output of limiter 48 or limiter 46, in which case the output will constitute a noise-free version of the input signal applied to input terminal 41.

A phase-tracking loop detector according to this invention is particularly applicable to a beam-index color television receiver, such as the beam-index color television receivers described in copending patent applications Ser. No. 969,861, filed Dec. 15, 1978; Ser. No. 969,975, filed Dec. 15, 1978; and Ser. No. 972,236, filed Dec. 22, 1978; all having a common assignee herewith. Such application of the invention to a color television receiver will now be described with reference to FIG. 10.

As is known, a beam-index color television receiver employs a cathode ray tube 70 having therein an electron gun 71 from which a single electron beam is emitted, and a phosphor screen 72 on the face plate or panel of the tube 70 having red, green and blue phosphor stripes arranged sequentially and repetitively in the horizontal scanning direction, with index phosphor stripes being arranged in the horizontal scanning direction on the side of the phosphor screen facing the electron gun. Such index phosphor strips emit light as the electron beam scans across them, and the detection of such emitted light, as by a photodetector 73, permits control of color switching so that the electron beam can be density-modulated by red, green and blue primary color signals when the electron beam scans across red, green and blue phosphor stripes, respectively.

In existing beam-index color television receivers, the output signal $S_p$ from photodetector 73 is applied to a bandpass filter, whose bandpass center frequency is fixed. The frequency of the index signal obtained from the bandpass filter is determined by the pitch, or spacing, of the index phosphor stripes and by the horizontal scanning speed of the electron beam. The index signal is provided from the bandpass filter to a phase-locked loop (PLL) circuit to be frequency-multiplied. The output signal derived from the PLL circuit is then frequency-divided by a ring counter to derive three-phase gating pulses, shifted in phase by 120° from one another, to be used to gate, in sequence, respective primary color signals. The gated primary color signals are then applied to the color cathode ray tube for density modulating the electron beam.

In general, the scanning speed of the electron beam is not constant, for any of a variety of reasons, including, for instance, non-linearity of the horizontal deflection field of the receiver, so that the frequency of the index signal fluctuates as the electron beam scans in the horizontal direction. In order to process the fluctuating index signal, it has been necessary to use a low-Q bandpass filter having a sufficiently wide bandwidth. Unfortunately, because the photodetector 73 used to provide the index signal is subject to cross-modulation with the luminance signal, the primary color signals, and the above-mentioned gate pulses, there is substantial inherent noise and interference associated with the index signal, both above and below the frequency of the index signal itself. In addition, other noise may be generated in the photodetector 73. For that reason, a conventional beam index color television receiver using a wideband bandpass filter, will allow noise and interference to be passed along with the index signal. Thus, the quality of the picture provided on the cathode ray tube in a conventional arrangement is often unsatisfactory. A substantial improvement in the picture quality of beam-index color television receivers can be achieved if a phasetracking loop circuit according to the present invention is used in place of the conventionally used bandpass filter. The bandwidth of the tracking filter 43 (FIG. 5), when thus used, can be made quite narrow to eliminate interference and noise, and since the bandpass center frequency of the tracking filter 43 will track the frequency of the input index signal, the filter 43 will be responsive to variations in the index signal. Thus, an index signal which is relatively free of interference and noise can be provided, thereby enhancing the picture quality.

Figure 10:
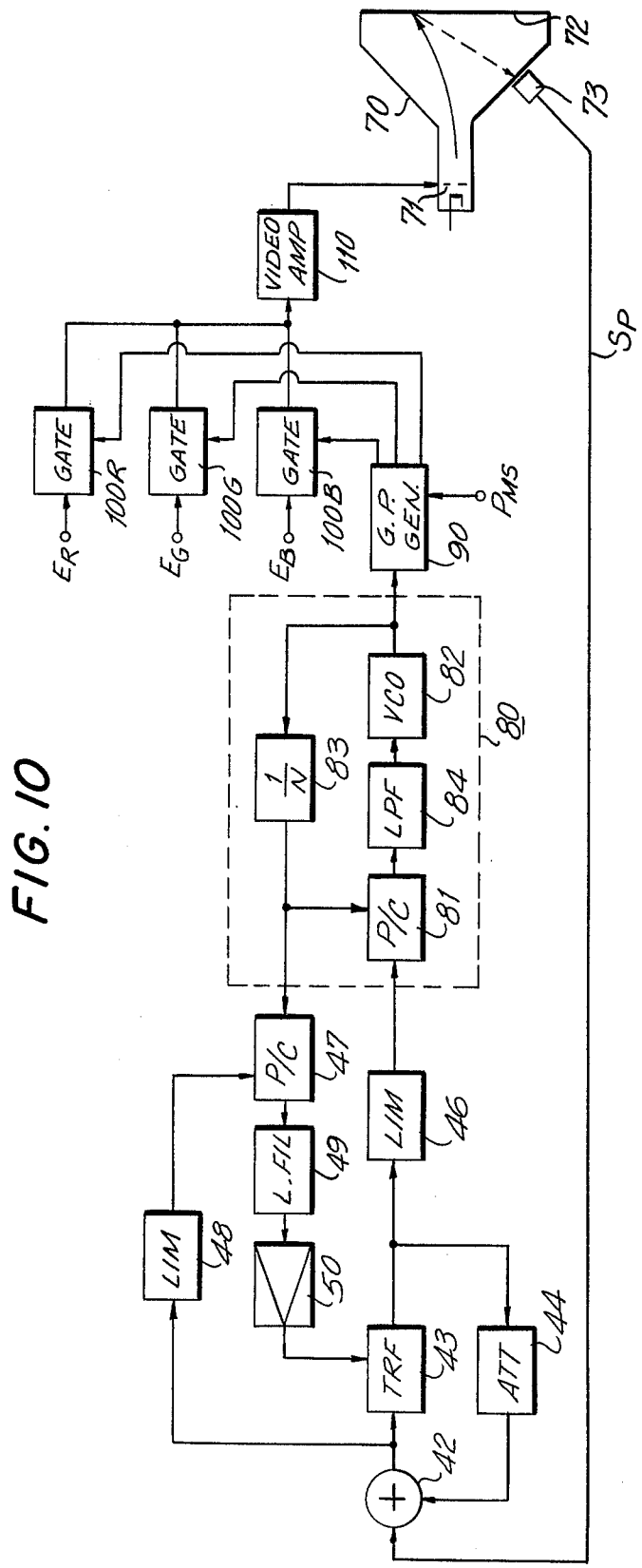
FIG. 10 is a schematic block diagram showing a beam index color television receiver in which a PTL circuit according to another embodiment of the present invention is employed.

In the embodiment of a beam-index color television receiver incorporating the present invention as shown in FIG. 10, elements corresponding to those described above are identified by the same reference numerals. In such receiver, the photodetector 73 located outside the envelope of the cathode ray tube 70 again detects the light emitted when the electron beam issuing from gun 71 scans across the index stripes. The output signal $S_p$ provided from the photodetector 73 is supplied as an input signal for the PTL circuit 42–50. In the illustrated embodiment, a phase-locked loop (PLL) circuit 80 serves as a 90° phase shifter. More particularly, the signal which is passed by the tracking filter 43 is fed through limiter 46 to the PLL circuit 80. Within the PLL circuit 80, the signal from limiter 46 is applied to one input of a phase comparator 81, and an oscillating signal from a voltage-controlled oscillator 82 is supplied to a frequency divider 83 which has its frequency divided output applied to another input of phase comparator 81. The output signal from phase comparator 81 is applied through a low-pass filter 84 to the voltage-controlled oscillator 82 to control the frequency of the oscillating signal.

Because three primary color signals are to be gated, the voltage-controlled oscillator 82 can conveniently be chosen to have a center frequency three times the so-called triplet frequency, that is, the frequency at which the electron beam scans the repeating groups of color phosphor stripes, and the frequency divider 83 can be selected to divide the output of oscillator 82 to the extent necessary to provide substantial frequency equivalence between the output of divider 83 and the output of tracking filter 43. Thus, for example, if the pitch of the index stripes is $\frac{2}{3}$ the pitch of the groups or triads of color phosphor stripes, the frequency divider 83 will divide by 2. The oscillating signal provided by voltage-controlled oscillator 82 is used to control the gating or color switching of the color signals, and the output signal from frequency divider 83, which has the same frequency as the index signal as passed by the limiter 46, but shifted in phase by 90° from the index signal, is applied to the phase comparator 47 of the PTL circuit according to this invention.

More particularly, the oscillating signal from voltage-controlled oscillator 82 is shown to be applied to a gating pulse generator 90, which may include a ring counter, and which is also supplied with a suitably provided mode set pulse $P_{MS}$. Thus, after being initially set by the mode set pulse $P_{MS}$, gate pulse generator 90 produces sequential three-phase gating pulses for gating red, green and blue primary color signals $E_R$, $E_G$ and $E_B$. Such gating pulses are applied to gate circuits 100R, 100G and 100B, respectively, which are fed with respective primary color signals $E_R$, $E_G$ and $E_B$. Thus, gate circuits 100R, 100G and 100B sequentially supply the gated primary color signals $E_R$, $E_G$ and $E_B$ through a video amplifier 110, to a convenient control input of the electron gun 71, such as a first grid thereof. Since the tracking filter 43 has its center frequency varied precisely in accordance with variations in the frequency of the output signal $S_p$ from photodetector 73, for example, due to the changes in the horizontal scanning velocity, noise and interference can be effectively eliminated as an influence on the gating pulses so that color switching is accurately effected.

Although preferred embodiments of the present invention have been described in detail herein with reference to the accompanying drawings, it is apparent that the invention is not limited thereto, and that many modifications and variations could be quite readily effected therein by a person skilled in the art without departing from the scope or spirit of the invention as defined in the appended claims.

What is claimed is:

1. A phase-tracking loop circuit comprising:
    adder means having inputs for receiving respective signals and providing a combined signal therefrom;
    means for applying an input signal of varying frequency to one of said inputs of the adder means;
    tracking filter means receiving said combined signal for passing a frequency band thereof having a center frequency which is shiftable in response to a control signal applied to said tracking filter means;
    attenuator means for applying an attenuated version of the output of said tracking filter means to another of said inputs of the adder means; and
    means for comparing the phase of said combined signal with the phase of said output of the tracking filter means and providing a corresponding control signal to said tracking filter means for shifting said center frequency.

2. The phase-tracking loop circuit of claim 1, further comprising limiter means to limit amplitude fluctuations of said output of the tracking filter means to be compared with said combined signal.

3. The phase-tracking loop circuit of claim 1, further comprising limiter means to limit amplitude fluctuations in said combined signal to be compared with said output of the tracking filter means.

4. The phase-tracking loop circuit of claim 1, further comprising loop filter means to filter high frequency noise out of said control signal.

5. The phase-tracking loop circuit of claim 4, wherein said loop filter means includes an integrator coupled between said means for comparing the phase and said tracking filter means.

6. The phase-tracking loop circuit of claim 5, wherein said loop filter means also includes a loop amplifier connected between said integrator and said tracking filter means.

7. The phase-tracking loop circuit of claim 1, wherein said means for comparing the phase includes a phase comparator of the type which provides a neutral control voltage when the respective phases of the signals compared therein are separated by 90°; and further comprising phase shifter means in advance of said phase comparator to shift by 90° the phase of one of said combined signal and said output of the tracking filter means.

8. The phase-tracking loop circuit of claim 7, wherein said phase shifter means includes an integrator connected between said tracking filter means and said phase comparator.

9. The phase-tracking loop circuit of claim 7, wherein said phase shifter means includes a phase-locked loop circuit having first and second outputs in response to said one of said combined signal and said output said tracking filter means, said first output providing an output signal of said phase-tracking loop circuit and said second output being applied to said phase comparator as a 90° phase-shifted version of said one of said combined signal and said output of the tracking filter means.

10. The phase-tracking loop circuit of claim 1, wherein said tracking filter means includes an input terminal to which is fed said combined signal an inductance having two end terminals one of which is connected to said input terminal, and a center tap, a pair of variable capacitance diodes each having first and second electrodes, said variable capacitance diodes being connected in series back-to-back relation with the first electrode of each said diode being connected to a respective end terminal of said inductance, and the second electrodes of said diodes being connected to each other to define a control terminal, said control signal being applied between said control terminal and said center tap, and said end terminals providing said output of the tracking filter means thereacross.

11. A video display device for displaying a color image in response to a plurality of primary color signals comprising:

a beam index color cathode-ray tube having beam generating means for emitting an electron beam whose intensity is controlled in response to the intensity of said primary color signals, a display screen made up of a repetitive pattern of groups of color phosphor stripes for emitting light of respective different colors when scanned by said beam, an array of index stripes arranged in a predetermined pattern on said display screen to emit light when scanned by said beam, and photosensor means providing an index signal in response to said light emitted from said index stripes;

adder means having inputs for receiving said index signal and another signal, respectively, and providing a combined signal therefrom;

tracking filter means receiving said combined signal for passing a frequency band thereof having a center frequency which is shiftable in response to a control signal applied to said tracking filter means;

attenuator means for applying an attenuated version of the output of said tracking filter means as said other signal received by said adder means;

phase-locked loop means providing first and second outputs with respective phases controlled in response to the phase of said output of the tracking filter means;

means for comparing the phase of said combined signal with the phase of said first output of the phase-locked loop means and providing a corresponding control signal to said tracking filter means for shifting said center frequency; and gating means for supplying to said beam-generating means, in a predetermined order, said primary color signals, said gating means being controlled by said second output of said phase-locked loop means.

12. A video display device according to claim 11, further comprising means for limiting said combined signal as applied to said means for comparing the phase.

13. A video display device according to claim 11, further comprising means coupled between said tracking filter means and said phase-locked loop means for limiting the output of said tracking filter means as applied to said phase-locked loop means.

14. A video display device according to claim 11, wherein said attenuator means has an attenuation factor of substantially one half.

* * * * *